(12) United States Patent
Zhu et al.

(10) Patent No.: US 12,075,612 B2
(45) Date of Patent: Aug. 27, 2024

(54) SEMICONDUCTOR STRUCTURE AND METHOD FOR FORMING THE SAME, AND MEMORY AND METHOD FOR FORMING THE SAME

(71) Applicant: CHANGXIN MEMORY TECHNOLOGIES, INC., Hefei (CN)

(72) Inventors: Yiming Zhu, Hefei (CN); Er-Xuan Ping, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 328 days.

(21) Appl. No.: 17/426,503

(22) PCT Filed: Oct. 20, 2020

(86) PCT No.: PCT/CN2020/122083
§ 371 (c)(1),
(2) Date: Jul. 28, 2021

(87) PCT Pub. No.: WO2021/218059
PCT Pub. Date: Nov. 4, 2021

(65) Prior Publication Data
US 2022/0320107 A1  Oct. 6, 2022

(30) Foreign Application Priority Data
Apr. 27, 2020 (CN) .......................... 202010343498.7

(51) Int. Cl.
*H10B 12/00* (2023.01)
(52) U.S. Cl.
CPC ......... *H10B 12/482* (2023.02); *H10B 12/033* (2023.02); *H10B 12/05* (2023.02); *H10B 12/315* (2023.02)

(58) Field of Classification Search
CPC .... H10B 12/482; H10B 12/033; H10B 12/05; H10B 12/315; H10B 12/0335;
(Continued)

(56) References Cited

U.S. PATENT DOCUMENTS 10,134,739 B1  11/2018  Zang
2006/0113587 A1  6/2006  Thies
(Continued)

FOREIGN PATENT DOCUMENTS

CN  105336793 A  2/2016
CN  102468181 B  3/2016
(Continued)

OTHER PUBLICATIONS

ISR for International Application PCT/CN2020/122083 Mailed Jan. 29, 2021.
(Continued)

*Primary Examiner* — Thanh T Nguyen
(74) *Attorney, Agent, or Firm* — Kilpatrick Townsend & Stockton LLP (57) ABSTRACT

The present invention relates to a semiconductor structure and a method for forming the same, and a memory and a method for forming the same. The method for forming the semiconductor structure includes: providing a substrate on which a sacrificial layer and an active layer located on the sacrificial layer are formed; patterning the active layer to form several discrete active pillars; removing the sacrificial layer to form a gap; forming a bit line within the gap; and forming a semiconductor pillar on the top of the active pillar. The above method can reduce the planar size of the transistor and increase the storage density of the memory.

15 Claims, 9 Drawing Sheets

(58) Field of Classification Search
CPC ........ H10B 53/30; H10B 61/22; H10B 63/34; H10B 12/02; H10B 12/30; H01L 27/088; H01L 21/8234
See application file for complete search history.

(56) References Cited

U.S. PATENT DOCUMENTS

| | | | |
|---|---|---|---|
| 2009/0121315 | A1 | 5/2009 | Baars |
| 2013/0210211 | A1 | 8/2013 | Vereen et al. |
| 2019/0035791 | A1* | 1/2019 | Zang .................. H01L 29/1037 |
| 2019/0067370 | A1 | 2/2019 | Franca-Neto et al. |
| 2019/0074363 | A1 | 3/2019 | Zhu |
| 2023/0110504 | A1 | 4/2023 | Huilong |

FOREIGN PATENT DOCUMENTS

| | | |
|---|---|---|
| CN | 107946302 A | 4/2018 |
| CN | 208127209 U | 11/2018 |
| CN | 108987346 A | 12/2018 |
| CN | 109285836 A | 1/2019 |
| CN | 109285838 A | 1/2019 |
| CN | 110383476 A | 10/2019 |
| CN | 209641689 U | 11/2019 |

OTHER PUBLICATIONS

English translation of Written Opinion of the International Search Authority in the international application No. PCT/CN2020/122083, mailed on Jan. 29, 2021.
Supplementary European Search Report in the European application No. 20932910.1, mailed on Sep. 22, 2023. 8 pages.
First Office Action of the Chinese application No. 202010343498.7, issued on May 31, 2023. 7 pages.
Notice of Allowance of the Chinese application No. 202010228551.9, issued on Feb. 23, 2022.
English translation of Written Opinion of the International Search Authority in the international application No. PCT/CN2021/079979, mailed on May 31, 2021.

\* cited by examiner

SEMICONDUCTOR STRUCTURE AND METHOD FOR FORMING THE SAME, AND MEMORY AND METHOD FORMING THE SAME

CROSS-REFERENCE TO RELATED APPLICATIONS

The present application is a national phase entry of International Patent Application No. PCT/CN2020/122083, filed on Oct. 20, 2020, which claims priority to Chinese Patent Application No. 202010343498.7, filed on Apr. 27, 2020. The disclosures of the aforementioned patent applications are incorporated herein by reference in their entireties.

TECHNICAL FIELD

The present invention relates to the field of semiconductor technologies, and in particular to a semiconductor structure and a method for forming the same, and a memory and a method for forming the same.

BACKGROUND

An existing memory usually includes a data storage unit and a control transistor for controlling the data storage unit. The degree of integration of transistors restricts a storage density of the memory. In the prior art, in order to increase the storage density of the memory, for a planar transistor, the size of the transistor is reduced by reducing the channel size of the transistor.

However, as the channel size of the transistor reduces, the performance of the transistor is decreased due to a narrow channel effect and a short channel effect, which adversely affects the performance of the memory and restricts the further improvement of the size of the transistor and the storage density of the memory.

Currently, it is an urgent problem to reduce the planar size of the transistor and increase the storage density of the memory without decreasing the performance of the transistor.

SUMMARY

A technical problem to be solved by the present invention is to provide a semiconductor structure and a method for forming the same, and a memory and a method for forming the same, so as to further increase a storage density of the memory.

In order to solve the above problem, the present invention provides a method for forming a semiconductor structure, including: providing a substrate on which a sacrificial layer and an active layer located on a surface of the sacrificial layer are formed on a surface of the substrate; patterning the active layer to form several discrete active pillars; removing the sacrificial layer to form a gap; forming a bit line within the gap; and forming a semiconductor pillar on the top of the active pillar.

In one of the embodiments, the active layer is patterned for multiple times to form the active pillars, wherein at least one patterning step is performed after the bit line is formed.

In one of the embodiments, the method for forming the semiconductor structure further includes: forming a first doped region located within the active pillar; forming a channel region located within the semiconductor pillar and a second doped region located within a top region of the semiconductor pillar; and forming a gate structure surrounding the channel region.

In one of the embodiments, forming the first doped region includes: implanting ions into the active pillar to form the first doped region located within the active pillar; and forming the second doped region includes: implanting ions into the top region of the semiconductor pillar to form the second doped region located within the top region of the semiconductor pillar.

In one of the embodiments, forming the active pillar, removing the sacrificial layer and forming the bit line further include: etching the active layer and the sacrificial layer to form active lines extending in a first direction; forming a first isolation layer filling the space between the active lines; patterning the active lines to form several active pillars and several holes, a sidewalls of the holes exposing the sacrificial layer; removing the sacrificial layer along the hole to form a gap at the position of the sacrificial layer; and filling a conductive material within the gap to form the bit line extending in the first direction.

In one of the embodiments, removing the sacrificial layer and forming the bit line further includes: etching the active layer and the sacrificial layer to form active lines extending in a first direction; and forming a first isolation layer filling the space between the active lines; patterning the first isolation layers to form several holes within the first isolation layer between adjacent active lines, sidewalls of the holes exposing the sacrificial layer; removing the sacrificial layer along the hole to form a gap at the position of the sacrificial layer; and filling a conductive material within the gap and the hole to form the bit line extending in the first direction and removing the conductive material within the hole.

In one of the embodiments, the method for forming the semiconductor structure further includes: forming a through-hole at an end of the active line; and filling a conductive material within the through-hole to form a bit line connection line, the bottom of the bit line connection line being connected with the bit line.

In one of the embodiments, forming the active pillar further includes: after the bit line is formed, patterning the active lines to form several active pillars arranged in an array in a first direction and in a second direction.

In one of the embodiments, forming the first doped region includes: doping the active layer using an in-situ doping process to form a first doped layer during the process of forming the active layer using an epitaxial growth process; and patterning the first doped layer into a first doped region after the active layer is patterned to form the active pillars.

In one of the embodiments, forming the channel region and the second doped region includes: performing in-situ doping using an in-situ doping process to sequentially form the channel region and the second doped region during the process of forming the semiconductor pillar using an epitaxial growth process.

In one of the embodiments, the method for forming the semiconductor structure further includes: forming an isolation dielectric layer filling the space between the active pillars.

In one of the embodiments, forming the semiconductor pillar includes: forming a protective layer on the surfaces of the isolation dielectric layer and the active pillar; forming an epitaxial through-hole within the protective layer, the bottom of the epitaxial through-hole exposing a top surface of the active pillar; epitaxially growing a semiconductor material on the top surface of the active pillar to form a semiconductor pillar located within the epitaxial through-hole; and removing the protective layer.

In one of the embodiments, forming the semiconductor pillar includes: forming a semiconductor material on the top surface of the active pillar; and etching and trimming the semiconductor material to form a semiconductor pillar located on the top of the active pillar.

In one of the embodiments, forming the gate structure includes: sequentially forming a gate dielectric layer and a gate layer on the surface of the semiconductor pillar; and patterning the gate dielectric layer and the gate layer to form a gate structure which is located on the surfaces of the first isolation layer and the isolation dielectric layer and which surrounds the channel region within the semiconductor pillar, and expose the top region of the semiconductor pillar.

In one of the embodiments, the gate structures on the surfaces of the semiconductor pillars located on the same column arranged in the second direction are connected.

In one of the embodiments, the method for forming the semiconductor structure further includes: forming a second isolation layer covering the gate structure and the second doped region, the second isolation layer exposing the top surface of the second doped region.

The technical solution of the present invention further provides a semiconductor structure formed by the method described above.

The technical solution of the present invention further provides a memory, including: the semiconductor structure formed by the method described above; and a storage unit located above the semiconductor structure, the storage unit being connected to the top surface of the semiconductor pillar.

In one of the embodiments, the storage unit includes a capacitive storage unit, a magnetic storage unit, a ferroelectric storage unit, a phase change storage unit or a resistive storage unit.

The technical solution of the present invention further provides a method for forming a memory, including: providing the semiconductor structure formed by the method described above; and forming a storage unit above the semiconductor structure, the storage unit being connected to the top surface of the semiconductor pillar.

In one of the embodiments, the storage unit includes a capacitive storage unit, a magnetic storage unit, a ferroelectric storage unit, a phase change storage unit or a resistive storage unit.

With respect to the method for forming the semiconductor structure according to the present invention, the sacrificial layer and the active layer located on the surface of the sacrificial layer are formed on the substrate, and the bit line is used to replace the sacrificial layer so that the buried bit line is formed, thereby facilitating the subsequent formation of the vertical transistor; and the source/drain at the bottom of the vertical transistor is led out by the bit line. Moreover, in the method for forming the semiconductor structure according to the present invention, since the active layer is relatively thin, the semiconductor pillar formed by epitaxially growing the top of the active pillar formed by patterning the active layer can reduce the risk of collapse of the pattern after the active layer is patterned.

Further, the layout size of the vertical transistor is small, and the channel width is determined by the thickness of the active layer. Thus, an area of the transistor can be reduced without reducing the channel width, thereby improving the degree of integration of the semiconductor structure.

Further, removing the sacrificial layer along the plurality of formed holes can improve the efficiency of removing the sacrificial layer, and avoid the residue of the sacrificial layer, thereby improving the quality of the formed bit line.

The memory of the present invention includes a semiconductor structure with a vertical transistor array, which can increase the storage density of the memory in case that the size of the transistor is small.

BRIEF DESCRIPTION OF THE DRAWINGS

FIGS. 1 to 11C are schematic structural diagrams of a process for forming a semiconductor according to a specific embodiment of the present invention;

DETAILED DESCRIPTION

The specific embodiments of the semiconductor structure and the method for forming the same, and the memory and the method for forming the same provided by the present invention will be described in detail below with reference to the accompanying drawings.

Please refer to FIGS. 1 to 11C, which are schematic structural diagrams of a process for forming a semiconductor according to a specific embodiment of the present invention.

Figure 1:
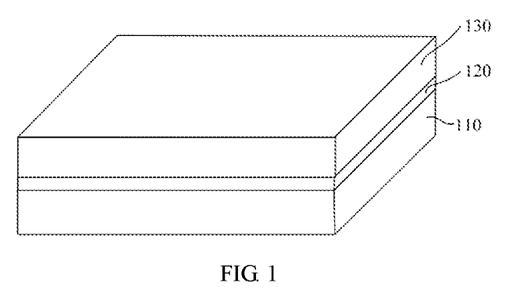

Please refer to FIG. 1, a substrate 110 is provided, and a sacrificial layer 120 and an active layer 130 located on a surface of the sacrificial layer 120 are formed on a surface of the substrate 110.

The substrate 110 may be made of various semiconductor materials such as monocrystalline silicon, germanium, and SiC, and may be of a single-layered structure or a multi-layered structure. For example, the substrate 110 includes a semiconductor base and a dielectric layer formed on a surface of the semiconductor base, which is not limited herein.

The sacrificial layer 120 and the active layer 130 may be sequentially formed on the surface of the substrate 110 by a deposition process. The active layer 130 may be made of one or more semiconductor materials such as Si, Ge, SiC or SiGe. The material of the sacrificial layer 120 is different from the material of the substrate 110 and the material of the active layer 130, which reduces the influence on the substrate 110 and the active layer 130 in a subsequent process of removing the sacrificial layer 120.

In this specific embodiment, the substrate 110 is a silicon substrate, the sacrificial layer 120 is a SiGe layer, and the active layer is a silicon layer. The sacrificial layer 120 is epitaxially formed on the surface of the substrate 110 using an epitaxial growth process, and then the active layer 130 is formed on the surface of the sacrificial layer 120 by an epitaxial process.

In fact, as long as the sacrificial layer 120 is made of a material different from that of the substrate 110 and that of the active layer 130, there is a high etching selection ratio between the sacrificial layer 120 and the substrate 110 and between the sacrificial layer 120 and the active layer 130 during the process of removing the sacrificial layer 120.

In some specific embodiments, the substrate 110, the sacrificial layer 120, and the active layer 130 may be an SOI substrate, and a buried oxide layer of the SOI substrate serves as the sacrificial layer 120.

In other specific embodiments, a doped layer may be formed inside a bulk silicon substrate as the sacrificial layer 120 by implanting ions into the bulk silicon substrate. For example, Ge is implanted into the bulk silicon substrate, a SiGe layer is formed inside the bulk silicon substrate as the sacrificial layer 120 by controlling the implantation depth of Ge, the silicon layer below the doped layer serves as the substrate 110, and the silicon layer above the doped layer serves as the active layer. In other specific embodiments, the doped layer may also be formed by implanting other elements such as C, O, and N, so that the etch rate of the doped layer is different from that of the material layers above and below the doped layer, thereby forming the sacrificial layer 120. Preferably, the material of the sacrificial layer 120 may be silicon oxide, silicon nitride, silicon oxynitride, silicon oxycarbide, and the like.

The active layer 130 is used to form a bottom doped region of a vertical transistor, namely, a source/a drain. The sacrificial layer 120 is used to be subsequently replaced to form the bit line. According to the size of the vertical transistor to be formed and the size of the bit line, the thickness of the sacrificial layer 120 and the thickness of the active layer 130 are set reasonably. In a specific embodiment, the thickness of the sacrificial layer 120 may be 35 nm~50 nm, and the thickness of the active layer may be set according to specific conditions. In this specific embodiment, the bottom doped region, the channel region above the bottom doped region, and the top doped region of the transistor are formed separately, which can reduce the thickness of the active layer 130, and thus can reduce the probability of collapse of the active pattern formed after subsequent patterning of the active layer 130.

Figure 2:
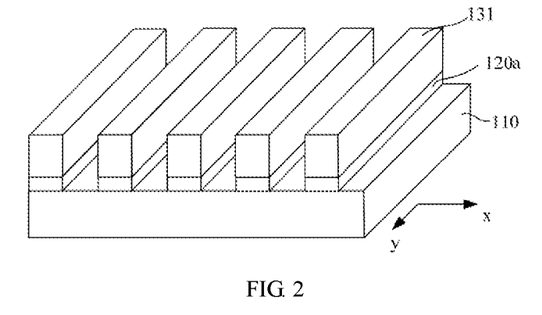

Please refer to FIG. 2, the active layer 130 and the sacrificial layer 120 are etched to the surface of the substrate 110 to form several active lines 131 arranged in parallel and extending in a first direction.

In this specific embodiment, forming the active lines 131 further includes: forming a patterned mask layer (not shown in the figure) on a surface of the active layer 130, wherein the patterned mask layer has an opening pattern extending in the first direction; and etching the active layer 130 and the sacrificial layer 120 with the patterned mask layer as a mask, so as to form elongated active lines 131 and elongated sacrificial layers 120a.

In this specific embodiment, the first direction is a y direction. The active layer 130 and the sacrificial layer 120 are etched using a dry etching process, and a corresponding etching gas is selected in the corresponding etching stage to etch the active layer 130 and the sacrificial layer 120.

Figure 3:
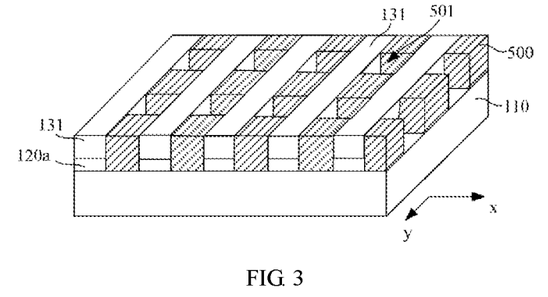

Please refer to FIG. 3, a first isolation layer 500 is formed on the surface of the substrate 110 to fill the spaces among the active lines 131; the first isolation layer 500 is patterned, so that several holes 501 are formed within the first isolation layer 500 between adjacent active lines 131, and the holes 501 expose the surface of the substrate 110, and the sidewalls of the holes 501 expose the sacrificial layers 120a.

The material of the first isolation layer 500 is different from that of the sacrificial layers 120a, and the material of the first isolation layer 500 is a dielectric material for providing electrical isolation among the active lines 131. In this specific embodiment, the material of the first isolation layer 500 is silicon oxide. In this specific embodiment, the method for forming the first isolation layer 500 is a chemical vapor deposition process, after an isolation material layer is formed on the surface of the substrate 100 to fill the spaces between the adjacent active lines 131 and to cover the top of the active lines 131, the isolation material layer is planarized to form the first isolation layer 500. In this specific embodiment, the top of the first isolation layer 500 is flush with the top of the active lines 131. In other specific embodiments, the patterned mask layer for patterning the active layer to form the active lines is reserved on the top of the active lines 131, and the first isolation layer 500 is flush with the patterned mask layer. In other specific embodiments, the patterned mask layer has been removed before the first isolation layer 500 is formed, and the first isolation layer 500 also covers the top of the active lines; and the top of the active lines 131 may be protected in the subsequent process.

After the first isolation layer 500 is formed, the first isolation layer 500 is etched to form a hole 501. The sidewalls of the hole 501 expose the sidewalls of the active lines 131 and the sidewalls of the sacrificial layers 120a. More than two holes 501 are formed between every two adjacent active lines 131. Specifically, the bottom of the hole 501 may expose the substrate 100 or may be located in the first isolation layer 500, as long as the bottom of the hole 501 exposes at least a part of the sidewalls of the sacrificial layers 120a.

In other embodiments, the hole 501 does not expose the sidewalls of the active lines 131. For example, the size of the hole 501 in the direction along the space between the active lines 131 is smaller than the length of the space between the active lines 131, so as to protect the active lines. Preferably, the first isolation layer 500 is a multi-layered dielectric layer. For example, the first isolation layer 500 is a combined layer of silicon oxide and silicon nitride, the silicon oxide is formed on the surface of the active lines 131, the silicon nitride fills the remaining space between the active lines 131, and the hole 501 is formed in the silicon nitride. The silicon oxide functions to protect the active lines 131.

In other embodiments, the holes are also formed at the ends of the same side of the active lines, or the holes are formed at the ends of both sides of the active lines. In addition, each of the active lines has only one end formed with the hole, and the holes at the ends of the same side are distributed at intervals to reduce the density of the holes in a local region and increase the process window. A bit line connection line may be formed in the holes at the ends while a bit line is subsequently formed by filling a conductive material, and the bit line connection line and the bit line are formed in the same process step to reduce the process cost.

Figure 4:
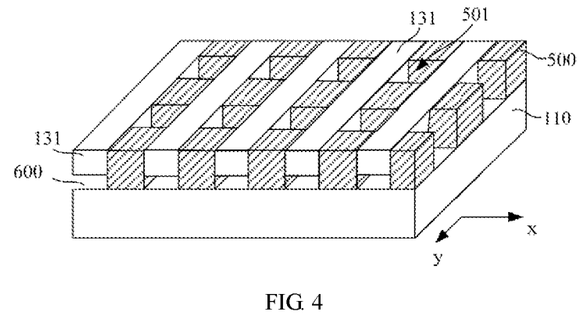

Please refer to FIG. 4, the sacrificial layer 120a is removed along the hole 501, so that a gap 600 is formed between the bottom of the active line 131 and the substrate 110.

The sacrificial layer 120a is removed using a wet etching process, and those skilled in the art may select an appropriate etching solution according to the material of the sacrificial layer 120a, so that the sacrificial layer 120a, the active line 131, and the first isolation layer 500 have a larger etching selection ratio during the wet etching process. Thus, the influence on the active line 131 and the first isolation layer 500 is reduced during the process of removing the sacrificial layer 120a.

After the sacrificial layer 120a is removed, the active line 131 is supported by the first isolation layer 500, and is suspended above the substrate 110; and the gap 600 is formed between the active line 131 and the substrate 110.

Figure 5A:
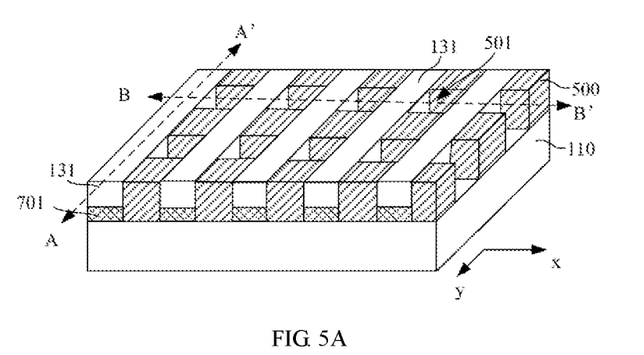
Figure 5B:
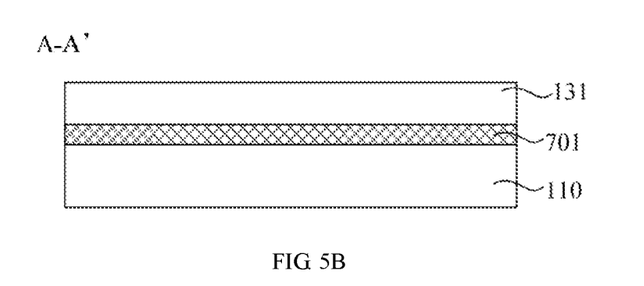
Figure 5C:
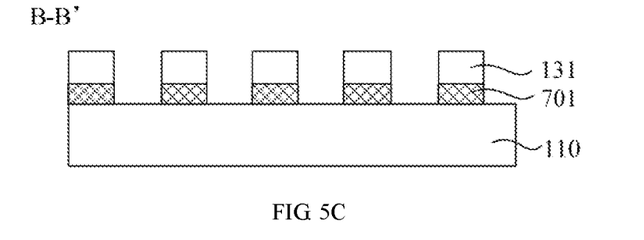

Please refer to FIGS. 5A to 5C, a conductive material is filled within the gap 600 to form a bit line 701 extending in the first direction. FIG. 5B is a schematic cross-sectional diagram along the secant line A-A' in FIG. 5A. FIG. 5C is a schematic cross-sectional diagram along the secant line B-B' in FIG. 5A.

A conductive material, for example, polysilicon or a metal material such as W, Co, Ag, or Al, may be formed within the gap 600 by a chemical vapor deposition process or a physical vapor deposition process. The conductive material may also be a multi-layered material, such as a combination of TiN and W.

The gap 600 is filled with the conductive material to form the bit line 701 located at the bottom of the active line 131. The hole 501 is also filled with the conductive material, and the top of the first isolation layer 500 and the top of the active line 131 are covered with the conductive material. The conductive material on the top of the first isolation layer 500 and on the top of the active line 131 is removed subsequently by etch-back treatment or planarization treatment, and the conductive material within the hole 501 is removed by etching treatment, so as to avoid that the bit lines 701 at the bottom of the adjacent active lines 131 are connected with each other.

Figure 6A:
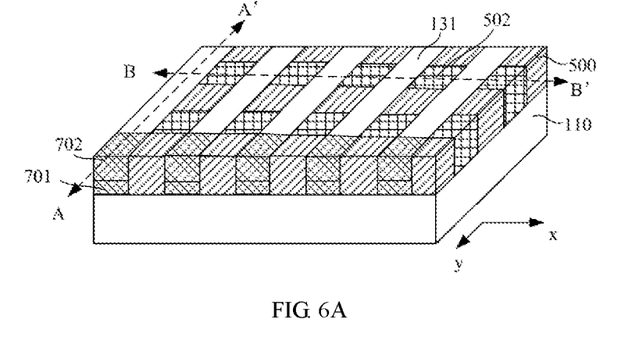
Figure 6B:
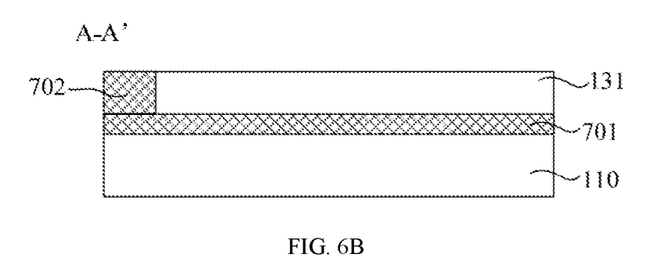
Figure 6C:
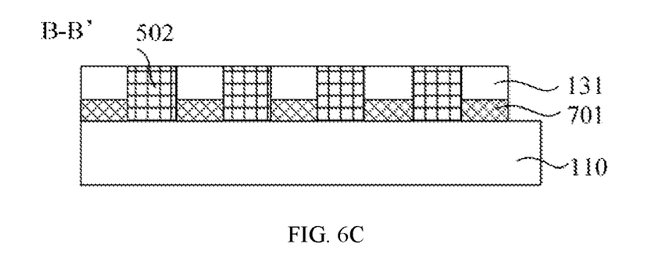

Please refer to FIGS. 6A to 6C, a through-hole exposing the surface of the substrate 110 is formed at an end of the active line 131; the through-hole is filled with a conductive material to form a bit line connection line 702, and the bottom of the bit line connection line 702 is connected with the bit line 701. FIG. 6B is a schematic cross-sectional diagram along the secant line A-A' in FIG. 6A. FIG. 6C is a schematic cross-sectional diagram t along the secant line B-B' in FIG. 6A.

Before the through-hole is formed by etching, an insulating dielectric material is filled into the hole 501 (Please refer to FIG. 7A) and is planarized to form an isolation dielectric layer 502. The surface of the isolation dielectric layer 502 is flush with the surface of the first isolation layer 500 or covers the entire top of the first isolation layer 500 and the entire top of the active line 131. The isolation dielectric layer 502 is used to provide electrical isolation between adjacent active lines 131 and used to provide a flat surface to form a mask layer for etching the active line 131 to form the through-hole.

In other specific embodiments, the isolation dielectric layer 502 may not be formed. During the process of etching the active line 131, the hole 501 is filled with the material of the mask layer, such as the bottom anti-reflection layer, so as to form a flat surface.

In this specific embodiment, the through-hole is formed at the end of the active line 131. In other specific embodiments, the through-hole may also be formed at other positions of the active line 131.

The bit line connection line 702 is formed by filling the conductive material into the through-hole and planarizing the conductive material. The bottom of the bit line connection line 702 is connected with the bit line 701 for leading out the bit line 701 buried below the active line 131 to facilitate the application of a control signal to the bit line 701. The bit line 701 is located below the active line 131, forms an electrical connection with a first doped region 1311 at the bottom of the active line 131, and extends along the extending direction of the active line 131.

In other specific embodiments, the through-hole may also be formed after an isolation layer 1200 is subsequently formed (referring to FIG. 11A), and the bit line connection line may be formed within the through-hole.

Figure 7A:
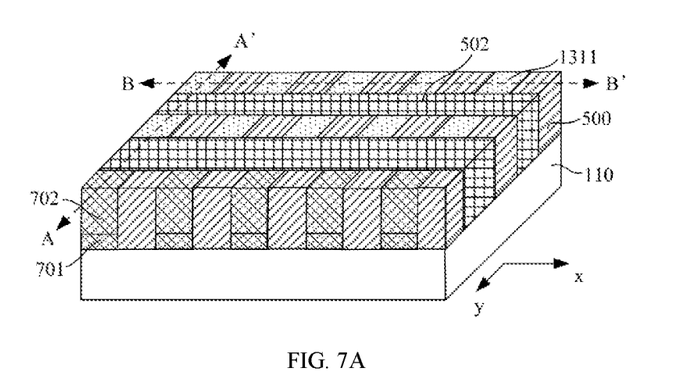
Figure 7B:
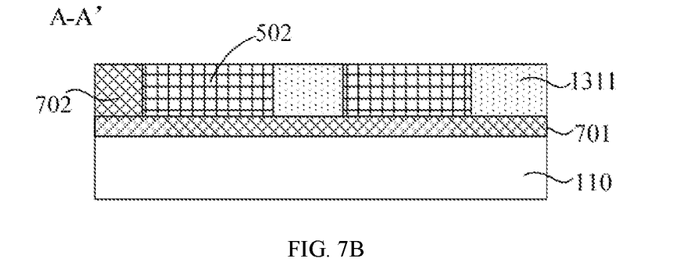
Figure 7C:
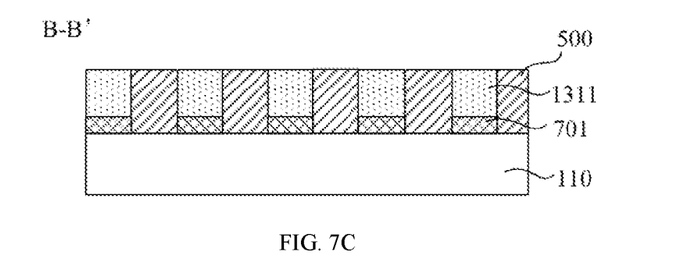

Please refer to FIGS. 7A to 7C, the active line 131 is patterned to form several discrete active pillars; and the active pillar is doped to form a first doped region 1311.

The active line 131 is patterned by a selective etching process to form the active pillars. The active pillars are arranged in an array in a first direction (y direction) and a second direction (x direction). In this specific embodiment, the angle between the first direction and the second direction is 90°. In other specific embodiments, the angle between the first direction and the second direction is 60°~120°.

In this specific embodiment, after the active pillar is formed, the first doped region 1311 is formed by implanting ions into the active pillar. In other specific embodiments, the first doped region 1311 may also be formed by diffusion treatment. Taking the active pillar as an example, specifically, a transition layer with doping elements is formed on the surface of the substrate 110 between the adjacent active pillars. At least a part of doping elements in the transition layer with doping atoms are diffused into the active pillar to form the first doped region 1311. In other specific embodiments, the doping process may be performed before the active line 131 is patterned.

The material of the transition layer may be deposited on the surface of the substrate 110 and then etched back to form a transition layer with a certain thickness, and the thickness of the transition layer may be adjusted according to the size requirements of the source/drain region of the transistor to be formed. In some specific embodiments, the thickness of the transition layer is equal to the height of the active lines 131 or the active pillars. In some specific embodiments, the transition layer may also cover the top of the active lines 131 or the top of the active pillars 132 to ensure that all regions of the active lines 131 or the active pillars are doped.

The material of the transition layer is different from the material of the active line, and may be a material that facilitates the diffusion of impurities, such as polysilicon, or may be other dielectric materials, such as silicon oxide, silicon nitride, and silicon oxynitride. Forming the transition layer with doping elements includes: forming an undoped transition layer with a certain thickness on the surface of the semiconductor substrate 110, and then doping the transition layer by ion implantation. At this time, the top of the active line 131 or the top of the active pillar is covered with the patterned mask layer, and the ion implantation can take place to only dope the transition layer by controlling the energy of the ion implantation. According to the type of transistor to be formed, N-type or P-type ions, or atomic clusters with N-type or P-type ions are implanted into the transition layer. The doping elements within the transition layer may exist in the form of ions, atoms, compound molecules or clusters. In other specific embodiments, the transition layer with doping elements may be directly formed through the in-situ doping process by adding a doping gas with doping elements into the deposition process gas during the process of forming the transition layer.

The diffusion treatment may be a thermal annealing process. According to the diffusion efficiency of the doping atoms, an annealing process with appropriate parameters is selected so that the doping elements in the transition layer are diffused into the active line 131 or the active pillar to form the first doped region 1311. The doping concentration in the first doped region formed after the diffusion treatment may be adjusted by adjusting the concentration of the doping elements in the transition layer, the diffusion treatment time, temperature and other parameters.

In other specific embodiments, the in-situ doping process may also be used. The active layer 130 is doped during the process of forming the active layer 130 by epitaxial deposition process; and the first doped region 1311 is formed after the active layer 130 is patterned.

Compared with forming the first doped region 1311 by ion implantation, diffusion or in-situ doping can reduce the damage to the surface of the active pillar (the first doped region 1311).

In this specific embodiment, after the first doped region 1311 is formed, the method for forming the semiconductor structure further includes filling an isolation material within the hole on the surface of the substrate 110 formed by patterning the active line 131 to form a flat surface.

In other specific embodiments, on the basis of FIG. 2, a first isolation layer filling the space between the active lines 131 is formed; the active lines 131 are patterned to form several active pillars and several holes, wherein the sidewalls of the holes expose the sacrificial layer; the sacrificial layer is removed along the hole to form a gap at the position of the sacrificial layer; and the gap is filled with a conductive material to form the bit line extending in the first direction. In other embodiments, the holes are also formed at the ends of the same side of the active lines 131, or the holes are formed at the ends of both sides of the active lines 131; and each of the active lines 131 has only one end formed with the hole, and the holes at the ends of the same side are distributed at intervals to reduce the density of the holes in a local region and increase the process window. A bit line connection line may be formed in the holes at the ends while a bit line is subsequently formed by filling a conductive material, and the bit line connection line and the bit line are formed in the same process step to reduce the process cost. Since the position of the hole changes, the position of the isolation dielectric layer that fills the hole also changes in the subsequent process steps, those skilled in the art can adaptively adjust some steps in the above-mentioned specific embodiments according to the needs, which are all within the protection scope of the present application.

Figure 8:
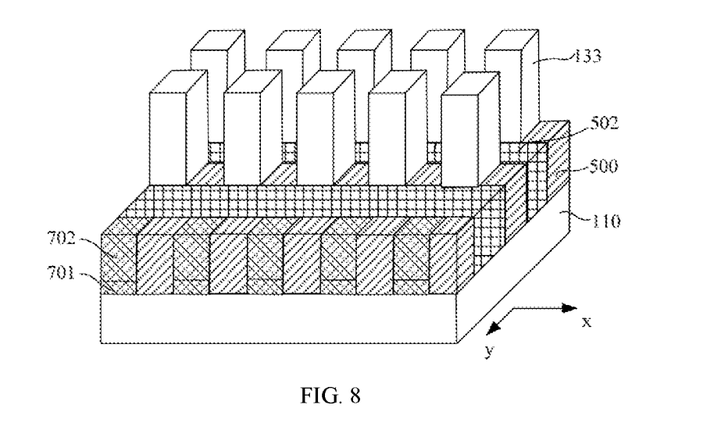

Please continue to refer to FIG. 8, a semiconductor pillar 133 is formed on the surface of the first doped region 1311.

In this specific embodiment, a semiconductor material is epitaxially grown on the top surface of the active pillar using a selective epitaxial process to form the semiconductor pillar 133 located on the top of the active pillar. Due to the selective epitaxial process, the semiconductor material is grown epitaxially only on the top surface of the active pillar, that is, on the top surface of the first doped region 1311, the material of the semiconductor pillar 133 is the same as the material of the active pillar, and is Si. In other specific embodiments, the material of the semiconductor pillar 133 may also be other semiconductor materials such as SiGe. After the semiconductor material with a certain thickness are epitaxially grown, the semiconductor material may be further etched and trimmed to form a semiconductor pillar 133 with a flatter surface.

In other specific embodiments, forming the semiconductor pillar includes: forming a protective layer on the surfaces of the first isolation layer, the bit line connection line, and the isolation dielectric layer; forming an epitaxial through-hole within the protective layer, the bottom of the epitaxial through-hole exposing a top surface of the active pillar; epitaxially growing a semiconductor material on the top surface of the active pillar to form a semiconductor pillar located within the epitaxial through-hole; and removing the protective layer. The growth size and position of the semiconductor pillar are limited by the epitaxial through-hole, and surface trimming by etching is not required. Thus, the problem such as collapse of the semiconductor pillar during the growth process or the trimming process can be avoided.

In other specific embodiments, a semiconductor material layer covering the surface of the structure shown in FIG. 7A may also be formed by a conventional deposition process, such as a CVD deposition process, and then the semiconductor material layer is patterned to form a semiconductor pillar located on the surface of the first doped region 1311.

Figure 9A:
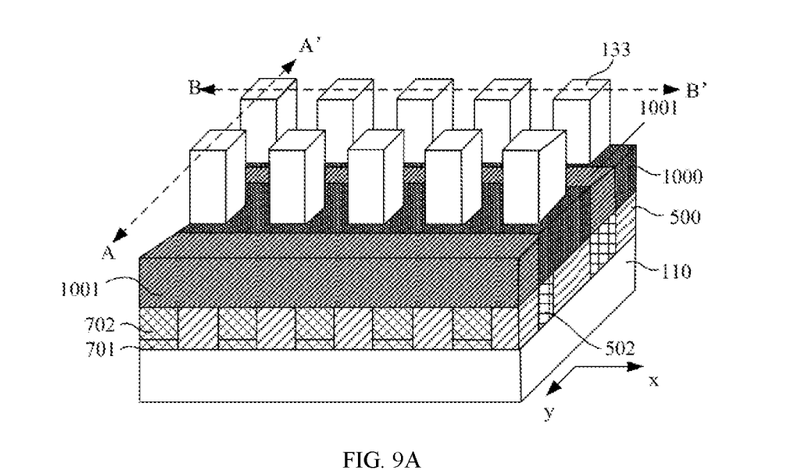
Figure 9B:
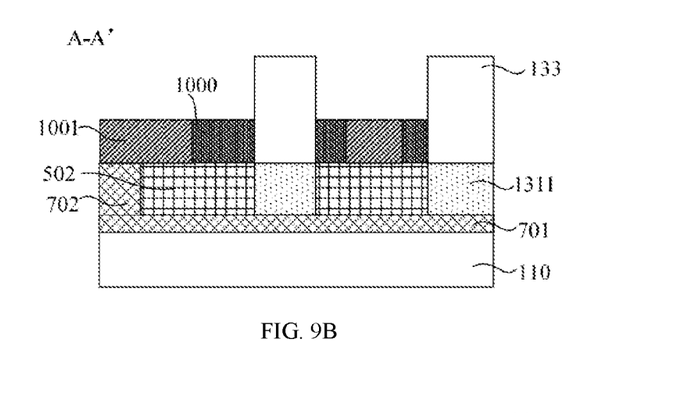
Figure 9C:
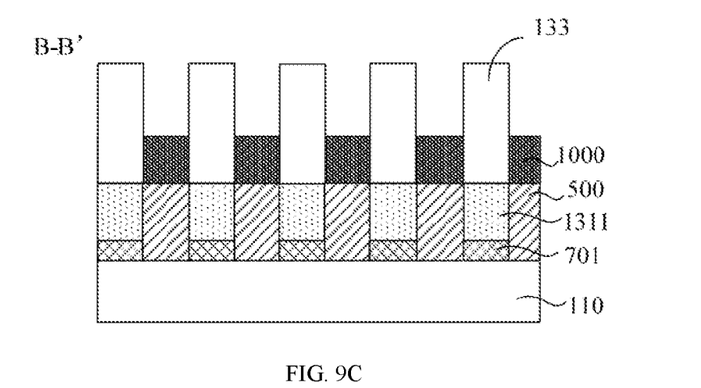

Please refer to FIGS. 9A to 9C, a channel region located on the surface of the first doped region 1311 and a gate structure 1000 surrounding the channel region are formed within the semiconductor pillar 133.

In the specific embodiments of the present invention, channel ion implantation may be performed on the semiconductor pillar 133 by ion implantation to form a channel region on the first doped region 1311, and the threshold voltage and other parameters of the transistor to be formed are adjusted by the channel ion implantation.

In other specific embodiments, channel doping may be performed at the corresponding position of the channel region by the in-situ doping process during the process of forming the semiconductor pillar 133.

A gate dielectric layer and a gate layer are sequentially formed on the surfaces of the semiconductor pillar 133, the first isolation layer 500, and the isolation dielectric layer 502; and the gate dielectric layer and the gate layer are patterned to form a gate structure 1000 surrounding the channel region of the semiconductor pillar 133, and expose the top region of the semiconductor pillar 133. The gate structure 1000 includes a gate layer and a gate dielectric layer. In FIGS. 9A to 9C, only the gate layer is shown, and the gate dielectric layer is omitted.

The gate dielectric layer may be made of a gate dielectric material such as silicon oxide, hafnium oxide, and aluminum oxide; and the gate layer may be made of a conductive material such as polysilicon, tungsten, copper, or aluminum.

Figure 9D:
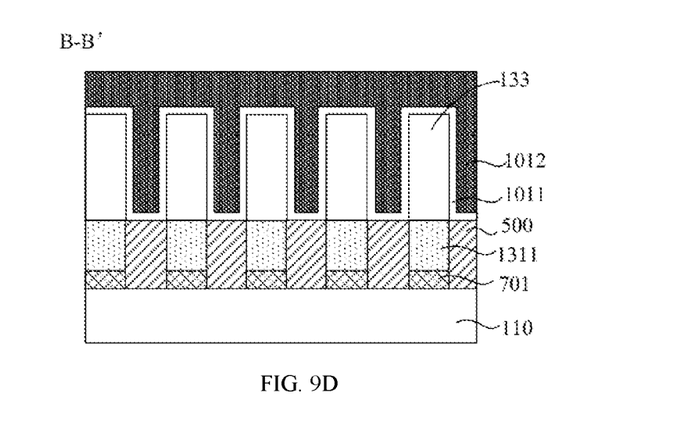
Figure 9E:
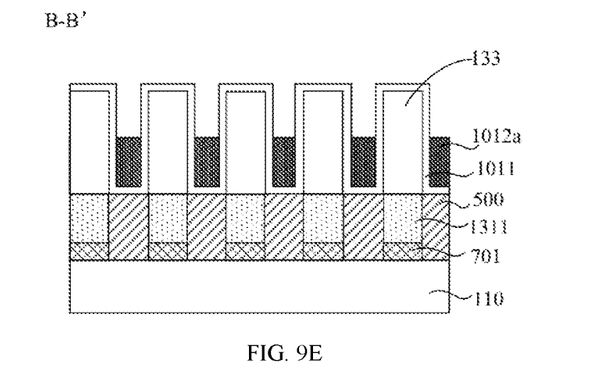
Figure 9F:
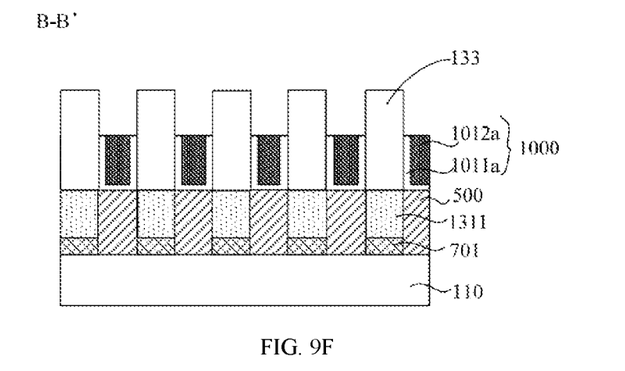

Please refer to FIGS. 9D to 9F, which are schematic structural diagrams of forming a gate structure 1000 according to a specific embodiment of the present invention. Please refer to FIG. 9D, a gate dielectric layer 1011 covering the surface of the structure shown in FIG. 8, and a gate layer 1012 may be sequentially formed by a deposition process, the gate layer entirely covers the structure below, and the top of the gate layer is higher than the top of the epitaxial semiconductor pillar 133. Please refer to FIG. 9E, the gate layer 1012 is etched by a planarization and etch-back process so that the height of the etched gate layer 1012a is lower than the top of the epitaxial semiconductor pillar 133. Please refer to FIG. 9F, the exposed gate dielectric layer covering the top of the epitaxial semiconductor pillar 133 is removed by a chemical dry etching process, and only the gate dielectric layer 1011a covered by the gate layer 1012 remains. Since the chemical dry etching process has the advantage of higher isotropic etching, the exposed gate dielectric layer can be fully removed. The gate layer 1012a and the gate dielectric layer 1011a constitute a gate structure 1000, and the gate structure 1000 surrounds the channel region of the epitaxial semiconductor pillar 133.

In this specific embodiment, the gate electrodes of the gate structures 1000 on the surfaces of the semiconductor pillars 133 on the same straight line arranged in the second direction (x direction) are connected to form a word line.

In other specific embodiments, the gate structures 1000 on the surfaces of all the semiconductor pillars 133 may also be independent of each other.

In order to electrically isolate the gate structures 1000 from each other, an isolation dielectric layer 1001 is filled between adjacent gate structures 1000 after the gate structures 1000 are formed. In other specific embodiments, the isolation dielectric layer 1001 may be formed first, then the isolation dielectric layer 1001 is patterned to form a hole, and the gate structure 1000 is formed within the hole.

Figure 10A:
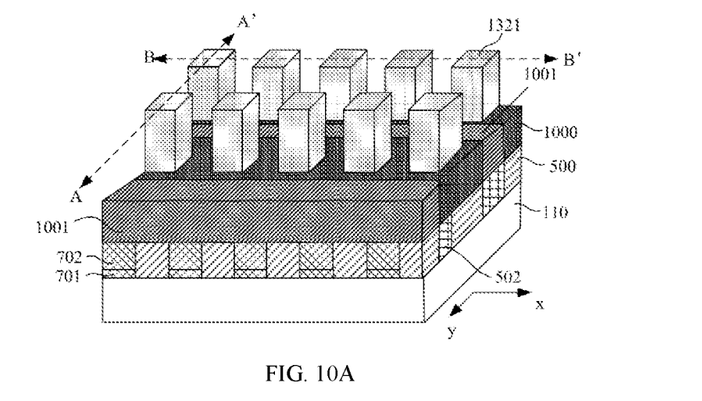
Figure 10B:
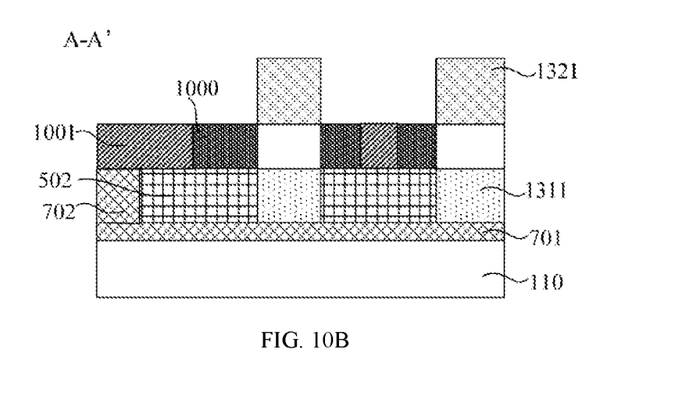
Figure 10C:
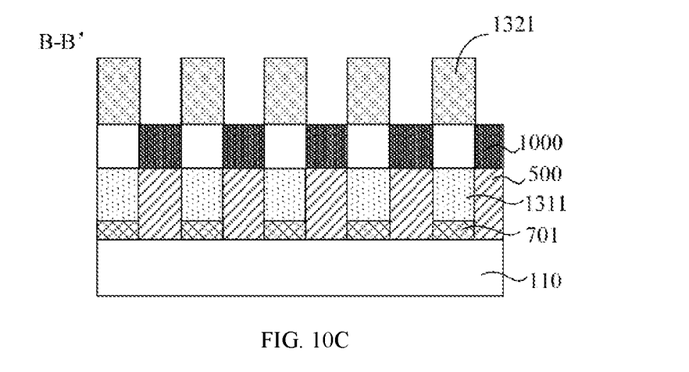

Please refer to FIGS. 10A to 10C, after the gate structures 1000 are formed, ions are implanted into the top region of the semiconductor pillar 133 to form the second doped region 1321.

The doping type of the second doped region 1321 is the same as the doping type of the first doped region 1311, and the second doped region 1321 and the first doped region 1311 respectively serve as the source or drain of the vertical transistor. In other specific embodiments, the second doped region 1321 may also be formed in the aforementioned steps by means of suitable in-situ doping, diffusion or implantation, which is be repeated herein.

Figure 11A:
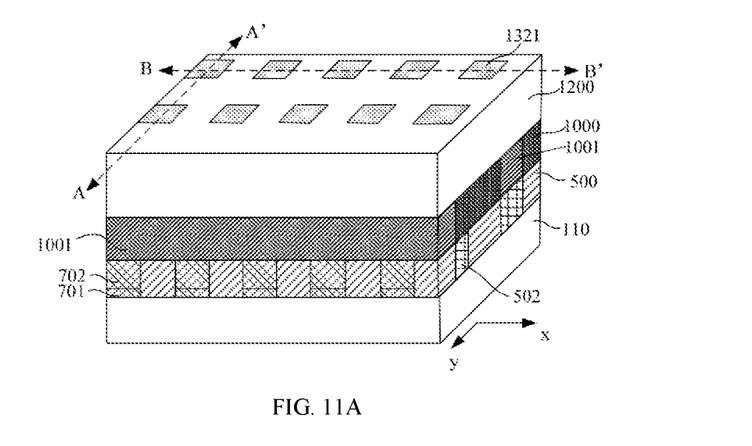
Figure 11B:
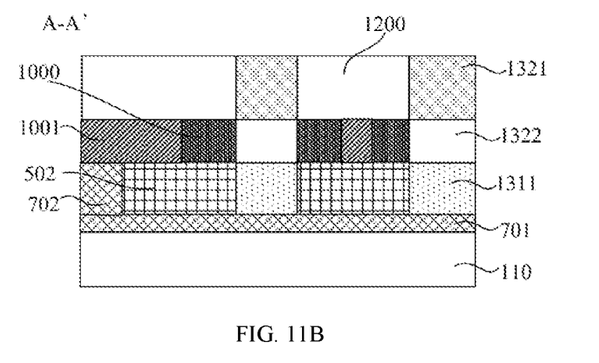
Figure 11C:
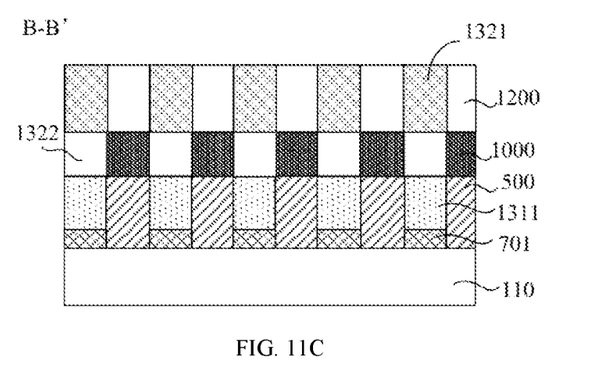

Please refer to FIGS. 11A to 11C, a second isolation layer 1200 covering the gate structure 1000 and the second doped region 1321 is formed. The second isolation layer 1200 exposes the top surface of the second doped region 1321.

The second isolation layer 1200 may be made of an insulating dielectric material such as silicon oxide, silicon oxynitride, or the like, forms the isolation layer among the vertical transistors together with the first isolation layer 500, the isolation dielectric layer 502, and the isolation dielectric layer 1001, and provide a flat surface for forming other semiconductor structures or material layers above the vertical transistors. In other specific embodiments, a bit line connection line that penetrates the second isolation layer 1200 and the first isolation layer 500 and is connected with the bit line 701 may also be formed in this step.

In other specific embodiments, an interconnection structure that penetrates the second isolation layer 1200 and is connected to the bit line connection line 702 may also be formed.

With respect to the forming method described above, the vertical transistor is formed on the substrate, and the buried bit line is formed between the first doped region at the bottom of the vertical transistor and the substrate, which can reduce the area of the transistor, and meanwhile, solve the problem of how to apply a bit line signal.

A specific embodiment of the present invention further provides a semiconductor structure.

Please refer to FIGS. 11A to 11C, which are schematic structural diagrams of a semiconductor structure according to a specific embodiment of the present invention.

The semiconductor structure includes: a substrate 110; a vertical transistor located on the substrate 110, including a first doped region 1311, a channel region 1322, a second doped region 1321, and a gate structure 1000 arranged around the channel region 1322, which are sequentially provided in an upward direction from the surface of the substrate 110; and a bit line 701 connected to the first doped region 1311 and located between the bottom of the first doped region 1311 and the substrate 110.

A plurality of the vertical transistors is formed on the semiconductor structure, and is arranged in an array in a first direction (y direction) and in a second direction (x direction), and the first doped regions 1311 at the bottoms of the vertical transistors on the same straight line arranged in the first direction are connected to the same bit line 701; and the gate structures 1000 of the vertical transistors on the same straight line arranged in the second direction are connected.

The semiconductor structure further includes: an isolation layer located on the substrate 110 and formed among the vertical transistors, wherein the isolation layer includes a first isolation layer 500 located between an adjacent bit line 701 and an adjacent first doped region 1311, and an isolation dielectric layer 502; and an isolation dielectric layer 1001 located between adjacent gate structures 1000 on the surfaces of the first isolation layer 500 and the isolation dielectric layer 502; and a second isolation layer 1200 located between adjacent second doped regions 1321 on the surface of the isolation dielectric layer 1001.

The semiconductor structure further includes: a through-hole that penetrates the first isolation layer 500, and a bit line connection line 702 is formed within the through-hole, and the bottom of the bit line connection line 702 is connected to the bit line 701. In this specific embodiment, the bit line connection line 702 is located on one side edge of the transistor array, and a bit line connection line 702 is formed on one side of each row of transistors arranged in they direction, and is connected to the bit line 701 below the row of transistors.

In this specific embodiment, the channel region 1322 and the second doped region 1321 of the vertical transistor are formed within the semiconductor pillar on the surface of the first doped region 1311, and the semiconductor layer where the channel region 1322 and the second doped region 1321 are located and the semiconductor pillar are not formed integrally, but are formed separately. In other specific embodiments, the first doped region 1311, the channel region 1322 and the second doped region 1321 of the vertical transistor are located within the same active pillar, and the active pillar is formed integrally. The first doped region 1311, the channel region 1322, and the second doped region 1321 are formed by doping.

The doped ions within the first doped region 1311 and/or the second doped region 1321 are formed by means of diffusion, in-situ doping or ion implantation.

A specific embodiment of the present invention further provides a memory and a method for forming the same.

First, the semiconductor structure as shown in FIGS. 11A to 11C is provided, and the specific description for the semiconductor structure is referred to the specific embodiments described above, which is repeated herein.

Figure 12:
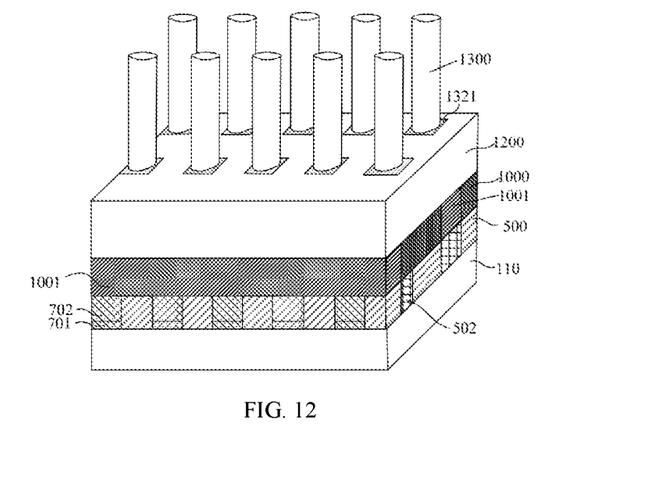
FIG. 12 is a schematic structural diagram of a memory according to a specific embodiment of the present invention.

Please refer to FIG. 12, a storage unit 1300 is formed above the vertical transistor, and the storage unit 1300 is connected to the second doped region 1321 of the vertical transistor.

In a specific embodiment, the memory is a DRAM memory, and the storage unit 1300 is a metal capacitor, which includes an upper electrode, a lower electrode, and a capacitor dielectric layer located between the upper electrode and the lower electrode. The capacitor may be a planar capacitor, a cylindrical capacitor, etc., and those skilled in the art may select a capacitor with a suitable structure as the storage unit according to a requirement. In FIG. 12, the storage unit 1300 is only an example, and does not represent the actual structure of the capacitor. In this specific embodiment, the second doped region 1321 of each transistor is connected to one storage unit to form a 1T1C storage structure. The storage unit may include one capacitor, or two or more capacitors connected in parallel.

In other specific embodiments, in order to reduce a connection resistance between the second doped region 1321 and the storage unit 1300, a metal contact layer may also be formed on the surface of the second doped region 1321, and the storage unit is formed on a surface of the metal contact layer.

The storage unit 1300 is formed within a dielectric layer (not shown in the figure), and an interconnection structure connecting the bit line connection line 702 and the gate structure 1000 may also be formed in the dielectric layer for connecting the bit line and the word line to an external circuit.

In other specific embodiments of the present invention, the storage unit may also be a magnetic storage unit, a ferroelectric storage unit, a phase change storage unit or a resistive storage unit.

Figure 13:
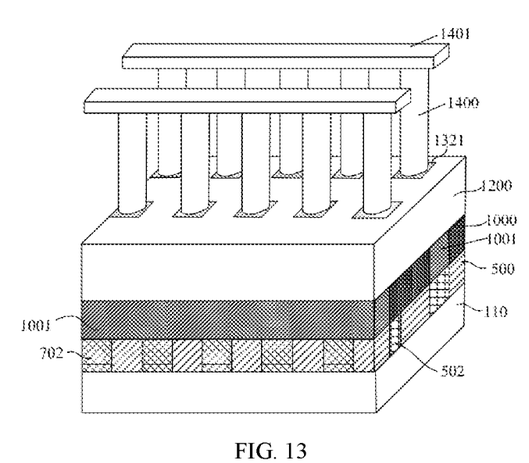
FIG. 13 is a schematic structural diagram of a memory according to a specific embodiment of the present invention.

Please refer to FIG. 13, which is a schematic structural diagram of a memory according to a specific embodiment of the present invention.

The memory is a FeRAM memory, and a ferroelectric storage unit 1400 is formed above the second doped region 1321 of the vertical transistor of the semiconductor structure shown in FIG. 11A.

The ferroelectric storage unit includes a lower electrode connected with the second doped region 1321, an upper electrode located above the lower electrode, and a ferroelectric capacitor made of a ferroelectric material layer located between the upper electrode and the lower electrode. The material of the ferroelectric material layer may be lead zirconate titanate (PZT) or barium strontium titanate (SBT). The ferroelectric storage unit 1400 in FIG. 13 is for illustration only, and does not represent the actual structure of the ferroelectric storage unit. Those skilled in the art should be able to form a ferroelectric storage unit 1400 with a corresponding structure as needed, which is not limited herein.

For the ferroelectric storage unit 1400, a plate line 1401 connected with the upper electrode may also need to be formed above the ferroelectric storage unit 1400. In this specific embodiment, the ferroelectric storage units arranged in the second direction (x direction) and located on the same straight line are connected to the same plate line 1401, and bidirectional pressurizing of the ferroelectric storage unit 1400 may be realized by the plate line 1401 and the vertical transistor below, so as to utilize a property of the ferroelectric material layer for data storage.

In other specific embodiments, a magnetic storage unit may also be formed on the second doped region 1321 of the vertical transistor. The magnetic storage unit includes a magnetic tunnel junction, and the magnetic tunnel junction includes a fixed layer, a free layer, and a dielectric layer located between the fixed layer and the free layer. The fixed layer is connected to the second doped region 1321.

In other specific embodiments, storage units of other structures or types may also be formed to form the corresponding memory.

With respect to the memory and the method for forming the same described above, the vertical transistor is used as the control transistor connected with the storage unit, and the buried bit line connected with the control transistor is used, which can increase the storage density of the memory.

The invention claimed is:

1. A method for forming a semiconductor structure, comprising:
    providing a substrate on which a sacrificial layer and an active layer located on the sacrificial layer are formed;
    patterning the active layer to form several discrete active pillars;
    removing the sacrificial layer to form a gap;
    forming a bit line within the gap; and
    forming a semiconductor pillar on the top of the active pillar;
    wherein removing the sacrificial layer and forming the bit line further comprises:
    etching the active layer and the sacrificial layer to form active lines extending in a first direction;
    forming a first isolation layer filling the space between the active lines;
    pattering the first isolation layers to form several holes within the first isolation layer between adjacent active lines, the sidewalls of the holes exposing the sacrificial layer;
    removing the sacrificial layer along the hole to form a gap at the position of the sacrificial layer; and
    filling a conductive material within the gap and the hole to form the bit line extending in the first direction and removing the conductive material within the hole.

2. The method for forming the semiconductor structure according to claim 1, wherein the active layer is patterned for multiple times to form the active pillars, wherein at least one patterning step is performed after the bit line is formed.

3. The method for forming the semiconductor structure according to claim 1, further comprising:
    forming a first doped region located within the active pillar;
    forming a channel region located within the semiconductor pillar and a second doped region located within a top region of the semiconductor pillar; and
    forming a gate structure surrounding the channel region.

4. The method for forming the semiconductor structure according to claim 3, wherein forming the first doped region comprises:
    implanting ions into the active pillar to form the first doped region located within the active pillar; and
    forming the second doped region comprises: implanting ions into the top region of the semiconductor pillar to form the second doped region located within the top region of the semiconductor pillar.

5. The method for forming the semiconductor structure according to claim 3, wherein forming the first doped region comprises:
    doping the active layer using an in-situ doping process to form a first doped layer during the process of forming the active layer using an epitaxial growth process; and
    patterning the first doped layer into a first doped region after the active layer is patterned to form the active pillars.

6. The method for forming the semiconductor structure according to claim 3, wherein forming the channel region and the second doped region comprises:
    performing in-situ doping using an in-situ doping process to sequentially form the channel region and the second doped region during the process of forming the semiconductor pillar using an epitaxial growth process.

7. The method for forming the semiconductor structure according to claim 3, wherein forming the gate structure comprises:
    sequentially forming a gate dielectric layer and a gate layer on the surface of the semiconductor pillar; and
    patterning the gate dielectric layer and the gate layer to form a gate structure surrounding the channel region within the semiconductor pillar, and expose the top region of the semiconductor pillar.

8. The method for forming the semiconductor structure according to claim 7, wherein the gate structures on the surfaces of the semiconductor pillars located on the same column arranged in the second direction are connected.

9. The method for forming the semiconductor structure according to claim 3, further comprising:
    forming a second isolation layer covering the gate structure and the second doped region, the second isolation layer exposing the top surface of the second doped region.

10. The method for forming the semiconductor structure according to claim 1, wherein forming the active pillar, removing the sacrificial layer, and forming the bit line further comprise:
- etching the active layer and the sacrificial layer to form active lines extending in a first direction;
- forming a first isolation layer filling the space between the active lines;
- patterning the active lines to form several active pillars and several holes, the sidewalls of the holes exposing the sacrificial layer; removing the sacrificial layer along the hole to form a gap at the position of the sacrificial layer; and
- filling a conductive material within the gap to form the bit line extending in the first direction.

11. The method for forming the semiconductor structure according to claim 1, further comprising:
- forming a through-hole at an end of the active line; and
- filling a conductive material within the through-hole to form a bit line connection line, the bottom of the bit line connection line being connected with the bit line.

12. The method for forming the semiconductor structure according to claim 1, wherein forming the active pillar further comprises:
- after the bit line is formed, patterning the active lines to form several active pillars arranged in an array in a first direction and in a second direction.

13. The method for forming the semiconductor structure according to claim 1, further comprising:
- forming an isolation dielectric layer filling the space between the active pillars.

14. The method for forming the semiconductor structure according to claim 13, wherein forming the semiconductor pillar comprises:
- forming a protective layer on the surfaces of the isolation dielectric layer and the active pillar;
- forming an epitaxial through-hole within the protective layer, the bottom of the epitaxial through-hole exposing a top surface of the active pillar;
- epitaxially growing a semiconductor material on the top surface of the active pillar to form a semiconductor pillar located within the epitaxial through-hole; and
- removing the protective layer.

15. The method for forming the semiconductor structure according to claim 13, wherein forming the semiconductor pillar comprises:
- forming a semiconductor material on the top surface of the active pillar; and
- etching and trimming the semiconductor material to form a semiconductor pillar located on the top of the active pillar.

* * * * *